United States Patent
Pelley, III et al.

(10) Patent No.: US 7,345,344 B2
(45) Date of Patent: Mar. 18, 2008

(54) EMBEDDED SUBSTRATE INTERCONNECT FOR UNDERSIDE CONTACT TO SOURCE AND DRAIN REGIONS

(75) Inventors: Perry H. Pelley, III, Austin, TX (US); Troy L. Cooper, Austin, TX (US); Michael A. Mendicino, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/356,229

(22) Filed: Feb. 16, 2006

(65) Prior Publication Data
US 2007/0200173 A1 Aug. 30, 2007

(51) Int. Cl.
*H01L 27/01* (2006.01)
(52) U.S. Cl. ................ 257/347; 257/353
(58) Field of Classification Search .............. 257/60, 257/347, 387, 389, 396, 401, 508; 438/149, 438/158, 159, 161, 218, 280, 300
See application file for complete search history.

(56) References Cited

U.S. PATENT DOCUMENTS

| | | | |
|---|---|---|---|
| 5,350,708 A * | 9/1994 | Yagishita et al. ........... 438/248 |
| 5,352,923 A | 10/1994 | Boyd et al. | |
| 5,610,099 A | 3/1997 | Stevens et al. | |
| 5,827,762 A | 10/1998 | Bashir et al. | |
| 6,140,674 A | 10/2000 | Hause et al. | |
| 6,407,427 B1 * | 6/2002 | Oh ............................ 257/347 |
| 6,580,137 B2 | 6/2003 | Parke | |
| 6,759,282 B2 * | 7/2004 | Campbell et al. .......... 438/149 |
| 6,838,332 B1 | 1/2005 | Sanchez et al. | |
| 6,891,263 B2 | 5/2005 | Hiramatsu et al. | |

* cited by examiner

*Primary Examiner*—Zandra V. Smith
*Assistant Examiner*—Paul E Patton

(57) ABSTRACT

A semiconductor topography (10) is provided which includes a semiconductor-on-insulator (SOI) substrate having a conductive line (16) arranged within an insulating layer (22) of the SOI substrate. A method for forming an SOI substrate with such a configuration includes forming a first conductive line (16) within an insulating layer (22) arranged above a wafer substrate (12) and forming a silicon layer (24) upon surfaces of the first conductive line and the insulating layer. A further method is provided which includes the formation of a transistor gate (28) upon an SOI substrate having a conductive line (16) embedded therein and implanting dopants within the semiconductor topography to form source and drain regions (30) within an upper semiconductor layer (24) of the SOI substrate such that an underside of one of the source and drain regions is in contact with the conductive line.

20 Claims, 2 Drawing Sheets

EMBEDDED SUBSTRATE INTERCONNECT FOR UNDERSIDE CONTACT TO SOURCE AND DRAIN REGIONS

BACKGROUND OF THE INVENTION

1. Field of the Invention

This invention generally relates to semiconductor processing and, more specifically, to the formation of interconnects within substrates for making underside contact to source and drain regions of field effect transistors.

2. Description of the Related Art

The following descriptions and examples are not admitted to be prior art by virtue of their inclusion within this section.

The fabrication of integrated circuits includes the formation of several different metallization structures, including interconnect lines, contacts, and vias, to connect conductive components of a circuit. In particular, contacts and vias are generally used to provide vertical electrical connections between conductive components arranged among different planes of a circuit. In some cases, contacts may refer to metallization structures used to connect a transistor component (e.g., a source or drain region or agate electrode) with an overlying interconnect line. In contrast, vias may refer to metallization structures used to connect two interconnect lines having an insulating layer interposed therebetween. The terms "contacts" and "vias", however, may be interchangeably referenced in some cases. In any case, interconnect lines differ from contacts and vias in that they are generally used to provide lateral electrical connections between conductive components arranged along a same plane parallel to a surface of a die substrate. The conductive components directly coupled to the interconnect lines may include contacts and/or vias. In other embodiments, interconnect lines may be formed in direct contact with a conductive element of a field effect transistor, such as a source or drain region or a transistor gate, without the use of a via or a contact and, thus, without an intervening insulating layer. Such interconnect lines do not permit traversal over unrelated conductive regions on the same plane of the die and, consequently, their routing is typically limited to interconnection between adjacent conductive elements and cannot be extended to traverse over several devices. For that reason, such interconnect lines are commonly referred to as "local interconnects."

In general, circuits are designed such that metallization structures are arranged as close as possible to each other and other device components of the circuit to minimize circuit area and die cost without causing circuit faults. In some cases, however, the arrangement of metallization structures may be limited, particularly in regard to components of field effect transistors. In particular, contact structures and local interconnects arranged upon surfaces of source and drain regions induce a parasitic gate-to-contact capacitance. Such a capacitance may limit the switching speed of a transistor, an affect which is expected to become more prevalent as smaller feature dimensions continue to be imposed by advancements in technology. In order to limit the level of such a capacitance, circuits are sometimes designed to have contact structures and/or local interconnects spaced a specific distance from a transistor gate. In conventional designs, such a spacing is generally greater than approximately 70 nm, causing valuable die space to be occupied. In particular, source and drain regions need to be sufficiently large to provide such a spacing as well as room for the contact structures or local interconnects and a margin of error for deviations of alignment when forming the contact structures or local interconnects on the source and drain regions.

In addition or alternative to the arrangement of local interconnects being limited with regard to the location of transistor gates, the restriction of local interconnects over limited regions of a circuit imparts a significant constraint for connecting conductive components within non-adjacent devices at a level near the base of the integrated circuit, forcing many interconnects to be formed at higher levels within a circuit. It is generally recognized, however, that the formation of features within design specifications becomes increasingly more difficult within higher levels of a circuit. In particular, as more levels of a circuit are formed, the planarity of the topography lessens. As a result, problems with step coverage of deposited materials may arise. Furthermore, if a topography is nonplanar, a patterned image may be distorted and the intended structure may not be formed to the specifications of the device.

BRIEF DESCRIPTION OF THE DRAWINGS

Other objects and advantages of the invention will become apparent upon reading the following detailed description and upon reference to the accompanying drawings in which.

Figure 1:
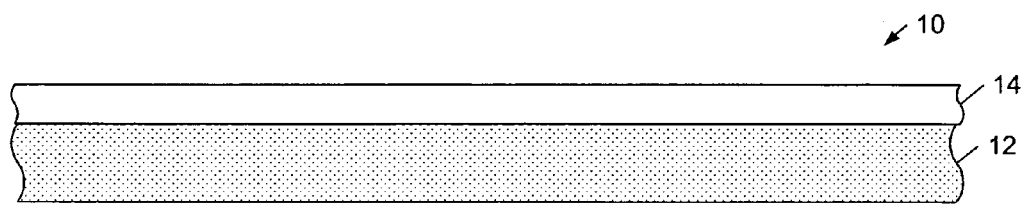
FIG. 1 depicts a partial cross-sectional view of a semiconductor topography having a first insulating layer formed upon a wafer substrate.

While the invention is susceptible to various modifications and-alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 5:
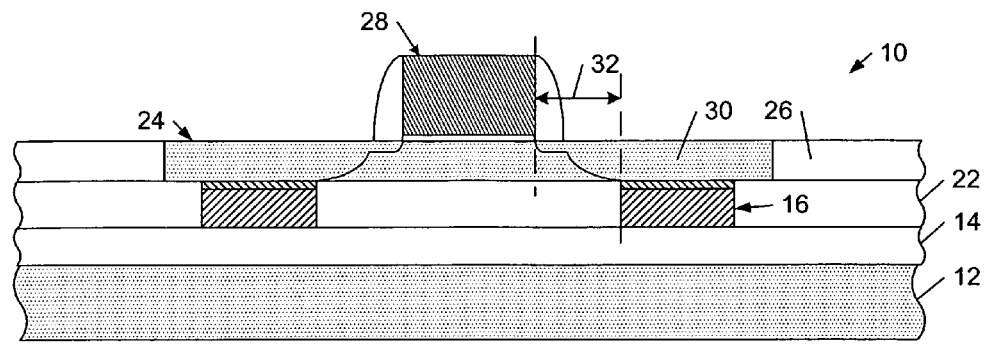
FIG. 5 depicts a partial cross-sectional view of the semiconductor topography in which a transistor is formed upon and within the semiconductor layer subsequent to its formation in FIG. 4.
Figure 6:
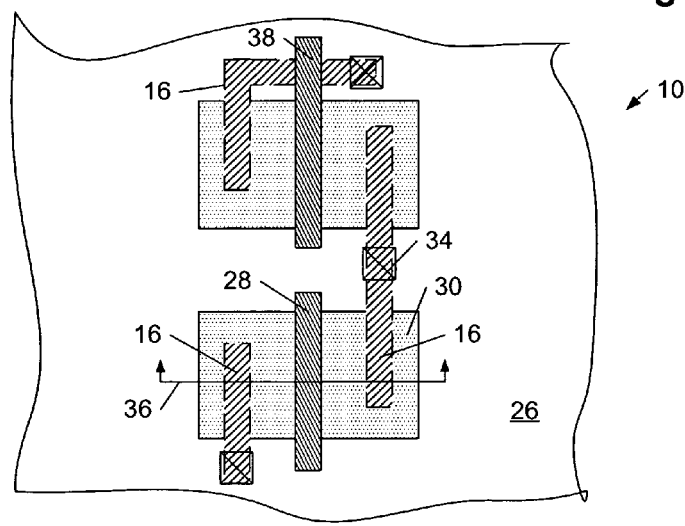
FIG. 6 depicts an exemplary partial plan view of the semiconductor topography depicted in FIG. 5.
Figure 7:
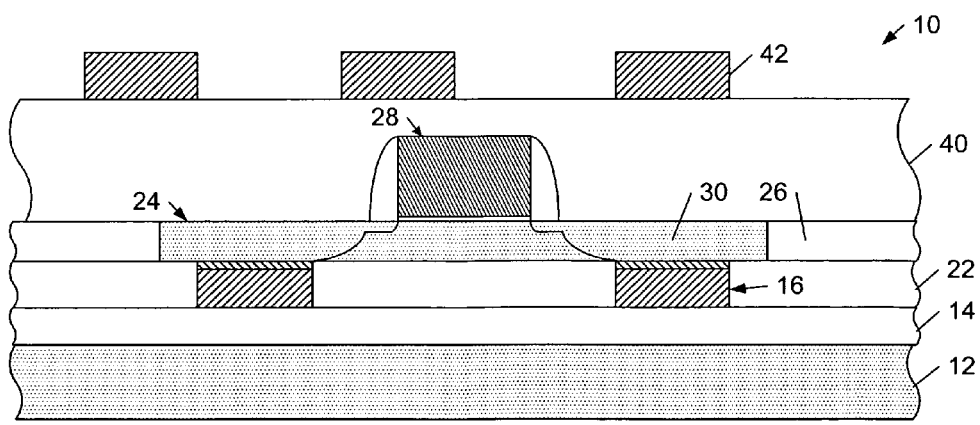
FIG. 7 depicts a partial cross-sectional view of the semiconductor topography in which a dielectric layer and overlying interconnect lines are formed above the transistor subsequent to its formation in FIG. 6.

With regard to the drawings, an exemplary method for fabricating a semiconductor-on-insulator (SOI) substrate with an embedded conductive line is shown in FIGS. 1-4. In addition, FIGS. 5-7 illustrate a method for processing a SOI substrate having an embedded conductive line such that one of a pair of source and drain regions extends through an upper semiconductor layer of the SOI substrate to the conductive line. As used herein, an "upper" semiconductor layer of a SOI substrate refers to the layer within the substrate above which devices, such as transistors, are most remotely formed or slated to be formed. Therefore, the orientation of a semiconductor topography including such a substrate (i.e., whether the topography is arranged sideways, flipped, or upright relative to the position of the upper semiconductor layer within the substrate) does not affect the reference of the upper semiconductor layer. In other words, the upper semiconductor layer of a SOI substrate may not necessarily be the topmost layer of the substrate, depending on the orientation of the substrate.

As noted below, the process steps described in reference to the fabrication of an SOI substrate in FIGS. 1-4 and the processing of a SOI substrate described in reference to FIGS. 5-7 are not necessarily mutually exclusive. In particular, several different sequences of processing steps may be considered for the fabrication of an SOI substrate with an embedded conductive line as described in more detail below in reference to FIGS. 1-4. Consequently, the method described in reference to FIGS. 5-7 for processing an SOI substrate having an embedded conductive line is not necessarily restricted to following the process steps depicted in FIGS. 1-4 for fabricating the substrate. Likewise, the manner in which an SOI substrate having an embedded conductive line is processed subsequent to its formation is not necessarily restricted to the sequence of steps outlined in reference to FIGS. 5-7. As such, although the SOI substrate described herein may be particularly applicable for forming source and drain regions in contact with the embedded conductive lines, the structure resulting from the substrate fabrication process described in reference to FIGS. 1-4 is not necessarily so restricted.

FIG. 1 illustrates semiconductor topography 10 including wafer substrate 12 and insulating layer 14 formed thereon. In come cases, wafer substrate 12 may be a semiconductor material. In particular, wafer substrate 12 may, in some embodiments, be a bulk substrate wafer of a semiconductor material. In other embodiments, wafer substrate 12 may include multiple layers, at least one of which includes a semiconductor material. For example, wafer substrate 12 may, in some cases, include a dielectric layer. In such embodiments, the dielectric layer may be of the same material or a different material than insulating layer 14 described in more detail below. Utilizing a substrate wafer having a semiconductor material has generally proven effective for the fabrication of integrated circuits in the semiconductor industry, but other substrate materials may be considered for semiconductor topography 10. For example, in some cases, wafer substrate 12 may include or may be entirely made of a conductive material.

As used herein, a semiconductor material may generally refer to a material in which its one or more non-dopant elements are selected essentially from Group IV of the periodic table or, alternatively, may refer to a material in which its plurality of synthesized non-dopant elements are selected from Groups II through VI of the periodic table. Examples of Group IV semiconductor materials which may be suitable for wafer substrate 12 include silicon, germanium, mixed silicon and germanium ("silicon-germanium"), mixed silicon and carbon ("silicon-carbon"), mixed silicon, germanium and carbon ("silicon-germanium-carbon"), and the like. Examples of Group III-V materials suitable for wafer substrate 12 include gallium arsenide, aluminum gallium arsenide, indium gallium arsenide, and the like. Other semiconductor materials are also possible for wafer substrate 12. It is noted that the nomenclature of semiconductor materials may generally refer to the non-dopant compositions of the materials consisting essentially of the referenced elements, but the materials are not restrained from having non-dopant impurities and/or dopants therein. For example, silicon-germanium has a non-dopant composition consisting essentially of silicon and germanium, but is not restricted to having dopants and/or impurities of other elements selected from Groups II through VI of the periodic table. As such, wafer substrate 12 may be undoped or may be doped with p-type or n-type dopants.

In general, insulating layer 14 may include a dielectric material, such as silicon dioxide, silicon nitride, silicon oxynitride, or any combination of such layers to provide electrical isolation between wafer substrate 12 and a conductive line subsequently formed upon insulating layer 14. In some cases, insulating layer 14 may be thermally grown from wafer substrate 12. In other embodiments, insulating layer 14 may be deposited. In either case, an exemplary range of thickness for insulating layer 14 may generally be between approximately 50 angstroms and approximately 300 angstroms. Larger or smaller thicknesses for insulating layer 14, however, may be employed depending on the design specifications of the ensuing devices. It is noted that the layers and structures depicted in FIGS. 1-7 are not necessarily drawn to scale. In particular, the dimensions of the layers and structures may be distorted to emphasize the fabrication of the topographies and, consequently, should not be restricted to the depictions of the drawings. For example, wafer substrate 12 may generally have a thickness of tens of microns, while insulating layer 14, as noted above, may generally have a thickness of tens to hundreds of angstroms.

Figure 2:
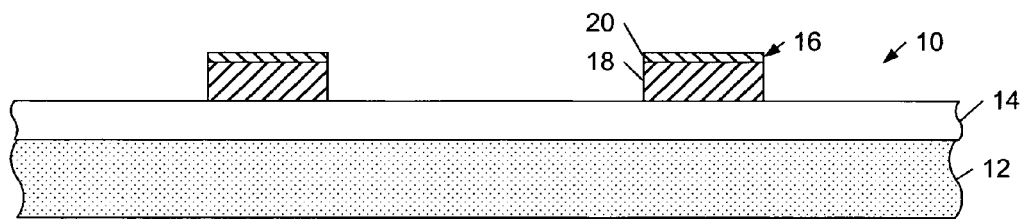
FIG. 2 depicts a partial cross-sectional view of the semiconductor topography in which conductive lines are formed upon the insulating layer subsequent to the insulating layer's formation in FIG. 1.

Subsequent to the formation of insulating layer 14, conductive lines 16 may be formed upon insulating layer 14 as shown in FIG. 2. Although two conductive lines of similar dimensions are depicted in FIG. 2, any number of conductive lines of any size and pattern may be formed thereon accordingly to the design specifications of the ensuing substrate. As shown in FIG. 2, conductive lines 16 may include bulk portion 18 and cap layer 20. Bulk portion 18 may generally include any conductive material, such as but not limited to doped amorphous silicon, doped polysilicon, aluminum, copper, tantalum, titanium, tungsten, or any metal alloy, nitride or silicide thereof or any material to be made conductive by subsequent implantations of dopants, such as undoped polysilicon, for example. In some embodiments, alloys of tungsten, such as a tungsten metal or tungsten silicide, may be advantageous for bulk portion 18 due to the good thermal stability properties of tungsten.

In other embodiments, it may be advantageous for bulk portion 18 to include amorphous silicon or polysilicon (either doped or doped by subsequent implantations of dopants). In particular, such materials may have similar processing properties as insulating materials and, thus, in some cases, may be more compatible with established techniques for processes slated to be performed subsequent to the formation of conductive lines 16. For example, when conductive lines 16 include polysilicon or amorphous silicon, bonding a semiconductor layer upon conductive lines 16 and an adjacent insulating material, as described below in reference to FIG. 4, may, in some embodiments, be conducted with process parameters similar to those established in the semiconductor industry for bonding a semiconductor layer to a topography only having an insulating layer upon its upper surface. On the contrary, when conductive lines 16 include a metal material, bonding a semiconductor layer to conductive lines 16 and an adjacent insulating layer may, in some embodiments, necessitate additional optimization of the bonding process since the metal material may affect the bonding process differently than the materials.

In any case, cap layer 20 may include a material configured to improve the contact resistance of bulk portion 18 and, thus, may include a different conductive material than bulk portion 18. Exemplary materials exhibiting low contact resistance include titanium and titanium nitride, but other materials may be used as well or alternatively for cap layer 20. In other cases, conductive lines 16 may not include cap layer 20. As such, conductive lines 16 are not necessarily restricted to their depiction in FIGS. 2-7. Regardless of their configuration, conductive lines 16 may be formed with any dimensions specified for ensuing devices. An exemplary thickness range may be between approximately 200 angstroms and approximately 500 angstroms, but smaller or larger thicknesses may be used. In addition, an exemplary width for conductive lines 16 may be the minimum dimension obtainable by a photolithographic tool used to form the line, but larger widths may be used. In some embodiments, the formation of conductive lines 16 may include the deposition of the materials included in the lines followed by known lithography process steps to pattern the materials. In alternative embodiments, conductive lines 16 may be formed by a damascene process in which the conductive lines are formed within trenches of insulating layer 14 spaced above wafer substrate 12. In such cases, the thickness of insulating layer 14 may be greater than noted above to accommodate the conductive lines. In addition, the formation of an additional insulating layer upon insulating layer 14, such as insulating layer 22 described below in reference to FIG. 3, may, in some embodiments, be omitted from the fabrication process in such cases.

Figure 3:
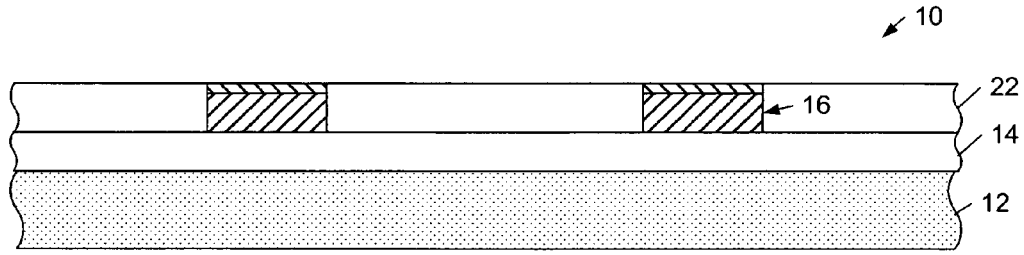
FIG. 3 depicts a partial cross-sectional view of the semiconductor topography in which a second insulating layer is formed about the conductive lines subsequent to their formation FIG. 2.

As shown in FIG. 3, insulating layer 22 may be formed adjacent to conductive lines 16 or, more specifically, coplanar with conductive lines 16. As with insulating layer 14, insulating layer 22 may include a dielectric material, such as silicon dioxide, silicon nitride, silicon oxynitride, or any combination of such layers. In some embodiments, insulating layer 22 may include the same material as insulating layer 14. In other embodiments, however, insulating layer 22 may include a different material than insulating layer 14. In general, insulating layer 22 may be deposited upon exposed portions of insulating layer 14 and, in some cases, upon upper surfaces of conductive lines 16. Subsequent thereto, semiconductor topography 10 may be polished such that upper surfaces of conductive lines 16 are exposed and are coplanar with portions of insulating layer 22. An exemplary resultant thickness for insulating layer 22 may generally be between approximately 200 angstroms and approximately 500 angstroms, but larger or smaller thicknesses may be employed depending on the design specifications of the ensuing devices. In yet other embodiments, insulating layer 22 may be omitted from semiconductor topography 10 as described above relative to the use of a damascene process to form conductive lines 16 within insulating layer 14.

In any case, insulating layer 14 and, in some embodiments, insulating layer 22 may serve as an insulating layer of an ensuing semiconductor-on-insulator (SOI) substrate. As such, insulating layers 14 and 22 may, in some embodiments, be referred to as sub-layers. In addition, conductive lines 16 may be described as being formed within (i.e., embedded) an insulating layer of a SOI substrate. As used herein, the terms "within" and "embedded" may refer a structure which is bound by a material on opposing sides of the structure. The reference, however, does not necessarily infer encapsulation by the material as shown by conductive lines 16 being substantially coplanar with insulating layer 22 in FIG. 3.

Figure 4:
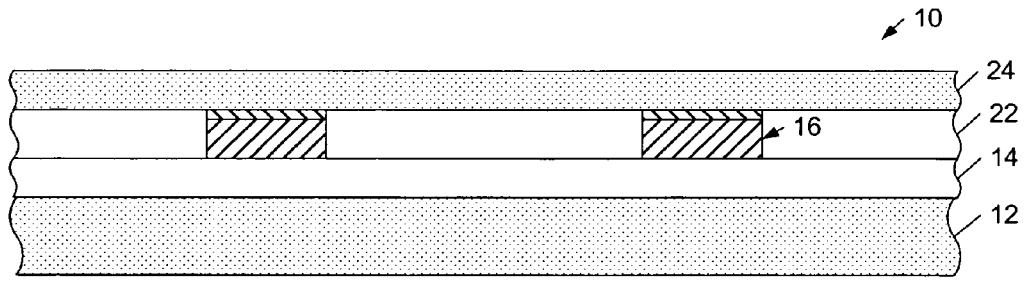
FIG. 4 depicts a partial cross-sectional view of the semiconductor topography in which a semiconductor layer is bonded to the upper surfaces of the conductive lines and the second insulating layer subsequent to the formation of the second insulating layer in FIG. 3.

In accordance with the fabrication of an SOI substrate, semiconductor layer 24 may be formed upon semiconductor topography 10 as shown in FIG. 4. In some cases, the formation of semiconductor layer 24 may include bonding a semiconductor wafer substrate upon the upper surfaces of conductive lines 16 and adjacent portions of insulating layer 22 and subsequently reducing the thickness the semiconductor wafer substrate within design specifications for an ensuing device. The bonding process may include any known technique for securing a semiconductor wafer substrate upon an insulating material, including but not limited to adhesion or surface activation. Furthermore, the reduction of thickness of the semiconductor wafer substrate may be performed by grinding or cleaving the semiconductor wafer substrate. In yet other cases, semiconductor layer 24 may be grown or deposited upon semiconductor layer 14. In any case, exemplary resultant thicknesses of semiconductor layer 24 may be between approximately 500 angstroms and approximately 1000 angstroms, but smaller or larger thicknesses may be employed. In general, semiconductor layer 24 may include any semiconductor material. In some cases, semiconductor layer 24 may include a silicon-based semiconductor material, such as monocrystalline silicon, silicon-germanium, silicon-carbon, silicon-germanium-carbon, and the like. In other embodiments, semiconductor layer 24 may include other types of semiconductor materials including an arsenide-based semiconductor material, such as gallium arsenide, aluminum gallium arsenide, indium gallium arsenide, and the like.

As noted above, the SOI substrate resulting from the fabrication processes described in reference to FIGS. 1-4 may be used for the fabrication of several different integrated circuit devices. As such, a number of different processing steps may follow the formation of semiconductor layer 24. An exemplary sequence of steps which may be particularly applicable for processing the SOI substrate illustrated in FIG. 4 -is outlined in FIGS. 5-7. In particular, FIGS. 5-7 illustrate the formation of a field effect transistor upon and within semiconductor layer 24 such that at least one of a pair of source and drain regions is electrically coupled to one of conductive lines 16. As noted above, however, the fabrication of a transistor with such a configuration is not necessarily restricted to SOI substrates having the configuration depicted in FIG. 4. For example, the sequence of fabrication steps described in reference to FIGS. 5-7 may alternately be conducted upon an SOI substrate in which conductive lines are formed within a single insulating layer by a damascene process.

FIG. 5 illustrates a field effect transistor formed upon and within semiconductor layer 24. In particular, FIG. 5 illustrates the formation of transistor gate 28 upon semiconductor layer 24 as well as source and drain regions 30 on either side of transistor gate 28 within semiconductor layer 24 extending down to conductive lines 16, respectively. In other words, source and drain regions 30 are formed such that their underside surfaces are in respective contact with conductive lines 16. In general, source and drain regions 30 may be formed by implanting dopants of either p-type or n-type conductivity within semiconductor topography 10, depending on the design specifications of the field effect transistor.

Although both of source and drain regions 30 are shown in contact with conductive lines 16, the ensuing device is not necessarily so limited. In particular, one of conductive lines 16 may be omitted from semiconductor topography 10 and, therefore, the underside surface of one of source and drain regions 30 may merely be in contact with the upper surface of insulating layer 22. In such cases, contact may be alternatively made to the region by a contact structure or a local interconnect upon the upper surface of the region. In the interest to limit the use of contact structures and local interconnects, it may be preferable, however, to make contact to both source and drain regions at their underside surfaces by conductive lines embedded within semiconductor layer 24 as shown in FIG. 5.

In addition to the field effect transistor, FIG. 5 illustrates the formation of isolation regions 26 within semiconductor layer 24 to isolate the active region in which the field effect transistor is formed. The fabrication of isolation regions 26 as well as spacers along the sidewalls of transistor gate 28 may generally follow methods known in the semiconductor industry and, therefore, are not described herein for the sake of brevity. In addition, although not shown, additional diffusion regions such as halo regions and/or channel stop regions may be formed within semiconductor layer 24 and, consequently, should not be presumed to be necessarily omitted based upon the depictions of the figures.

In general, transistor gate 28 may include any number of layers, including but not limited to a gate dielectric layer and one or more conductive layers, the composition of which may be any other those known in the semiconductor industry for transistor gates. In addition, the fabrication of transistor gate 28 may generally follow deposition and lithography techniques known in the semiconductor industry. In some embodiments, the formation of transistor gate 28 may include aligning a lithography tool used to pattern the gate relative to conductive lines 16. In particular, since the thickness of semiconductor layer 24 is relatively thin (i.e., on the order of approximately 100 nm), the arrangement of conductive lines 16 within semiconductor topography 10 may be detectable prior to the deposition of materials used to form transistor gate 28. Consequently, a lithography tool may be programmed to pattern ensuing transistor gate 28 in a position such that the subsequent formation of source or drain regions adjacent thereto may be arranged over conductive lines 16.

In some cases, transistor gate 28 may be formed laterally spaced from a sidewall of at least one of conductive lines 16 by a minimum distance 32 as shown in FIG. 5. As used herein, the term "laterally spaced" may generally refer to a gap between two respective structures, the referenced dimension of which is parallel to upper surfaces of the structures or, in the case of the methods and devices described herein, parallel to the upper surface of the SOI substrate. In some cases, minimum distance 32 may be configured to reduce any parasitic gate-to-conductive line capacitance which may affect the switching speed of the field effect transistor comprising transistor gate 28. However, since conductive lines 16 are vertically spaced from transistor gate 28, the parasitic gate-to-conductive line capacitance of the devices described herein may be lower than the parasitic gate-to-contact capacitance of devices in conventional circuit designs in which a contact structure is arranged upon a source or drain region of a transistor. As such, for a given transistor gate length, minimum distance 32 may be comparatively smaller than minimum distances specified for conventional circuit configurations.

For example, minimum distance 32 may be less than approximately 50 nm for technologies having transistor gate lengths of 90 nm or less and, in some cases, may be specifically between approximately 30 nm and approximately 40 nm. Larger or smaller minimum distances, however, may be employed, depending on the design specifications of the ensuing device. In yet other embodiments, the ensuing device may not be designed with specifications of a lateral spacing between conductive lines 16 and transistor gate 28 (i.e., the ensuing transistor may not have a minimum distance 32 design specification). As such, transistor gate 28 may be patterned to laterally overlap one or both of conductive lines 16. In other words, the sidewalls of one or both of conductive lines 16 may extend beneath transistor gate 28 in some embodiments. In such cases, conductive line 16 may provide electrical connection to the channel region of the transistor formed upon semiconductor layer 24, in effect forming a source-to-body tied device. In any case, the opposing sidewalls of conductive lines 16 may extend to regions beneath source and drain regions 30 as shown in FIG. 5 or may extend to regions beneath isolation regions 26, depending on the dimensional specifications of conductive lines 16 and source and drain regions 30.

In general, the arrangement of conductive lines 16 along the underside of source and drain regions 30 and, furthermore, the relatively small lateral spacing specification for arranging transistor gate 28 relative to conductive lines 16 may advantageously loosen alignment specifications for a transistor and/or allow higher density circuits to be fabricated. In particular, the specifications of alignment regarding the position of transistor gate 28 relative to conductive lines 16 may be loosened due to the larger area of source and drain region 30 along which conductive lines 16 may be arranged. In addition or alternatively, the size of source and drain regions 30 may, in some embodiments, be reduced relative to a conventional device, thereby allowing more devices to be fabricated upon a die of a given size. In particular, the dimensions of source and drain regions 30 extending from the sidewalls of transistor gate 28 may be reduced. More specifically, in cases in which transistor gate 28 may laterally overlap portions of conductive line 16, source and drain regions 30 do not have to be sized to provide room lateral spacing between such components or for the entire width of conductive lines 16. A reduction of size of source and drain regions 30 may also be realized in cases in which a minimum lateral spacing between transistor gate 28 and conductive lines 16 is specified. In particular, the spacing is generally smaller than those of conventional circuits of a given technology and, therefore, the size of source and drain regions 30 may be reduced.

As shown in FIG. 5, in cases in which two conductive lines 16 are arranged within the SOI substrate, the formation of transistor gate 28 may include patterning the gate in a region of semiconductor topography 10 between the conductive lines. Such an arrangement of transistor gate 28 is further shown in the plan view of semiconductor topography 10 in FIG. 6. In particular, FIG. 6 illustrates a plan view of semiconductor topography 10 from which the cross-sectional view of FIG. 5 is taken along line 36. As shown in the plan view of FIG. 6, one of conductive lines 16 may extend to a different active region over which different transistor gate 38 is formed and is isolated from transistor gate 28 by isolation region 26. Semiconductor topography 10 may further include an additional conductive line formed on the underside of the opposing source and drain regions 35 adjacent to transistor gate 38. Conductive lines 16 are outlined by dotted lines in FIG. 6 indicating their arrangement below isolation region 26 and source and drain regions 30 and 35. As shown in FIG. 6, the formation of additional transistor gate 38 may include patterning a portion of the gate over a portion of isolation region 26 which overlies a portion of one of conductive lines 16. Alternatively stated, a conductive line may be routed to pass beneath a transistor gate of an ensuing transistor in some circuit designs. As such, the arrangement of conductive lines 16 along the underside of source and drain regions generally allows greater flexibility in the routing conductive lines 16 and transistor gates relative to each other as well as relative to other conductive elements within the ensuing circuit. Consequently, conductive lines 16 may not be restricted to serving as local interconnect lines.

In general, semiconductor topography 10 may be subjected to further processing subsequent to the formation of the field effect transistors illustrated in FIG. 6. For example, exemplary positions of subsequently formed contact structures making contact with conductive lines 16 through portions of isolation region 26 are shown in FIG. 6 by cross-hatched boxes. Such placements of contact structures are exemplary as are the patterns of conductive lines 16 and, therefore, should not be presumed to restrict devices resulting from the method described herein. Other exemplary processing may include the formation of remote routing interconnects above the topography illustrated in FIG. 5. In particular, FIG. 7 illustrates a partial cross-sectional view of semiconductor topography 10 subsequent to the deposition of dielectric layer 40 over transistor gate 28 and upon the upper surfaces of source and drain regions 30 as well as subsequent to the formation of interconnect lines 42 upon dielectric layer 40.

As shown in FIG. 7, dielectric layer 40 is retained upon and across the entirety of the upper surfaces of source and drain regions 30 not covered by the sidewall spacers along transistor gate 28. In other words, neither contact structures nor local interconnect lines are formed upon the upper surfaces of source and drain regions 30 causing a parasitic gate-to-contact capacitance. Although three interconnect lines 42 are shown in FIG. 7, any number of interconnect lines may be formed upon dielectric layer 40, depending on the design specifications of the device. Furthermore, the arrangement of interconnect lines 42 relative to each other and relative to underlying components of semiconductor topography 10 are not necessarily restricted to the depiction of FIG. 7. Since conductive lines 16 contact the underside of source and drain regions 30, the formation of interconnect lines 42 may constitute the first layer of metallization above transistor gate 28, commonly referred to in the industry as "metal 1 layer" or "M1 layer". Such a configuration differs from many conventional circuit designs in that the M1 layer includes connections to source and drain regions of transistors and is generally limited to electrical connections between adjacent devices. Interconnect lines 42, however, may used for providing electrical connection between devices dispersed across a die and, therefore, may more generally be referred to as wiring layers.

It will be appreciated to those skilled in the art having the benefit of this disclosure that this invention is believed to provide a SOI substrate having embedded conductive lines for making underside contact to source and drain regions of field effect transistors and methods for fabricating such substrates and devices. Further modifications and alternative embodiments of various aspects of the invention will be apparent to those skilled in the art in view of this description. For example, the process steps described in reference to the fabrication of a SOI substrate in FIGS. 1-4 and the processing of a SOI substrate described in reference to FIGS. 5-7 are not necessarily mutually exclusive. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for processing a semiconductor topography, comprising:

forming a transistor gate over a semiconductor-on-insulator (SOI) substrate; and implanting dopants within an upper semiconductor layer of the SOI substrate to form source and drain regions such that an underside of the source region or the drain region is in electrical contact with a conductive line arranged within an insulating layer of the SOI substrate, wherein the step of forming the transistor gate comprises patterning a portion of the transistor gate over a portion of an isolation region arranged above a portion of the conductive line.

2. The method of claim 1, wherein the step of implanting the dopants comprises implanting the dopants such that an underside of the other of the source and drain regions is in contact with a different conductive line arranged within an insulating layer of the SOI substrate.

3. The method of claim 1, wherein the step of forming the transistor gate comprises aligning a lithography tool used to pattern the transistor gate relative to a position of the conductive line.

4. The method of claim 1, further comprising:

depositing a dielectric layer over the transistor gate and over the source and drain regions; and retaining at least a portion of the dielectric layer over an entirety of the source and drain regions while forming an interconnect line over the dielectric layer.

5. A method for processing a semiconductor topography, comprising:

forming a first conductive line and an insulating layer above a wafer substrate such that the first conductive line is within the insulating layer;

forming a semiconductor layer upon surfaces of the first conductive line and the insulating layer;

forming a transistor gate over the semiconductor layer such that a portion of the transistor gate overlies a portion of an isolation region arranged over the wafer substrate and over a portion of the first conductive line; and implanting dopants within the semiconductor layer to form source and drain regions within the semiconductor layer, wherein the source region or the drain region is electrically coupled to the first conductive line.

6. The method of claim 5, wherein the step forming the semiconductor layer comprises bonding a semiconductor wafer to the surfaces of the first conductive line and the insulating layer.

7. The method of claim 5, wherein the step of forming the first conductive line and the insulating layer comprises:

forming a first insulating sub-layer upon a wafer substrate;

forming the first conductive line upon the first insulating sub-layer;

forming a second insulating sub-layer upon the first conductive line and adjacent portions of the first insulating sub-layer; and polishing the second insulating sub-layer to expose the first conductive line.

8. The method of claim 5, wherein the step of forming the first conductive line and the insulating layer comprises forming the first conductive line, the insulating layer, and a second conductive line above the wafer substrate such that the first and second conductive lines are within the insulating layer.

9. The method of claim 1, further comprising:

forming active regions from portions of the upper semiconductor layer, wherein the active regions are spaced apart from each other;

forming a field isolation region that surrounds the active regions, wherein a portion of the field isolation region overlies the conductive line; and forming a contact structure to the conductive line, wherein the contact structure extends through the field isolation region and is spaced apart from the active regions.

10. The method of claim 5, further comprising:

forming active regions from portions of the semiconductor layer, wherein the active regions are spaced apart from each other;

forming a field isolation region that surrounds the active regions, wherein a portion of the field isolation region overlies the first conductive line; and forming a contact structure to the first conductive line, wherein the contact structure extends through the field isolation region and is spaced apart from the active regions.

11. A method of forming an integrated circuit comprising:

forming a conductive line and an insulating layer over a substrate, wherein the insulating layer surrounds the conductive line;

forming active regions over portions of the insulating layer, wherein the active regions are spaced apart from each other and the substrate, and wherein the active regions includes a first active region;

forming a field isolation region that surrounds the active regions, wherein a portion of the field isolation region overlies the conductive line;

forming a transistor gate over the first active region;

implanting a dopant within the first active region to form source and drain regions such that an underside of the source region or the drain region is in electrical contact with the conductive line; and forming a contact structure to the conductive line, wherein the contact structure extends through the field isolation region and is spaced apart from the active regions.

12. The method of claim 11, wherein the step of implanting the dopant comprises implanting the dopant such that an underside of the other of the source and drain regions is in contact with a different conductive line within the insulating layer.

13. The method of claim 11, wherein the step of forming the transistor gate comprises aligning a lithography tool used to pattern the transistor gate relative to a position of the conductive line.

14. The method of claim 11, wherein the step of forming the transistor gate comprises patterning a portion of the transistor gate over a portion of the field isolation region.

15. The method of claim 11, further comprising:

depositing a dielectric layer over the transistor gate and the source and drain regions; and retaining at least a portion of the dielectric layer over an entirety of the source and drain regions while forming an interconnect line upon an upper surface of the dielectric layer.

16. A method of forming an integrated circuit comprising:

forming a first conductive line and an insulating layer over a substrate, wherein the insulating layer surrounds the first conductive line;

forming a semiconductor layer upon surfaces of the first conductive line and the insulating layer;

patterning the semiconductor layer to form semiconductor regions that are space apart from each other and the substrate, wherein the semiconductor regions includes a first semiconductor region;

forming a field isolation region that surrounds the semiconductor regions, wherein a portion of the field isolation region overlies the first conductive line;

implanting a dopant within the first semiconductor region to form a doped region such that the doped region is in electrical contact with the first conductive line; and forming a contact structure to the conductive line, wherein the contact structure extends though the field isolation region and is spaced apart from the semiconductor regions.

17. The method of claim 16, wherein the step of forming the first conductive line and the insulating layer comprises:

forming a first insulating sub-layer over the substrate;

forming the first conductive line upon the first insulating sub-layer;

forming a second insulating sub-layer upon the first conductive line and adjacent portions of the first insulating sub-layer; and polishing the second insulating sub-layer to expose the first conductive line.

18. The method of claim 16, wherein the step of forming the first conductive line and the insulating layer comprises forming the first conductive line, the insulating layer, and a second conductive line above the substrate such that the first and second conductive lines are within the insulating layer.

19. The method of claim 16, further comprising:

forming a transistor gate over the first semiconductor region; and implanting a dopant within the first semiconductor region comprises forming source and drain regions, wherein the source region or the drain region is electrically coupled to the first conductive line.

20. The method of claim 18, wherein the step of forming the transistor gate comprises patterning a portion of the transistor gate over a portion of the field isolation region and over a portion of the first conductive line.

* * * * *